(12) United States Patent
Akiyama et al.

(10) Patent No.: US 10,777,670 B2
(45) Date of Patent: Sep. 15, 2020

(54) VERTICAL INSULATED GATE TURN-OFF THYRISTOR WITH INTERMEDIATE P+ LAYER IN P-BASE FORMED USING EPITAXIAL LAYER

(71) Applicant: Pakal Technologies, Inc., San Francisco, CA (US)

(72) Inventors: Hidenori Akiyama, Miyagi (JP); Richard A. Blanchard, Los Altos, CA (US)

(73) Assignee: Pakal Technologies, Inc., San Francisco, CA (US)

( * ) Notice: Subject to any disclaimer, the term of this patent is extended or adjusted under 35 U.S.C. 154(b) by 0 days.

(21) Appl. No.: 16/425,152

(22) Filed: May 29, 2019

(65) Prior Publication Data

US 2019/0393331 A1    Dec. 26, 2019

Related U.S. Application Data

(60) Provisional application No. 62/689,622, filed on Jun. 25, 2018.

(51) Int. Cl.
| | |
|---|---|
| *H01L 21/332* | (2006.01) |
| *H01L 29/745* | (2006.01) |
| *H01L 29/66* | (2006.01) |
| *H01L 21/04* | (2006.01) |

(52) U.S. Cl.
CPC ...... *H01L 29/7455* (2013.01); *H01L 21/0455* (2013.01); *H01L 29/66378* (2013.01)

(58) Field of Classification Search
CPC .................. H01L 21/7455; H01L 29/7455
USPC .......................................... 438/136, 137, 138
See application file for complete search history.

(56) References Cited

U.S. PATENT DOCUMENTS

| | | | | |
|---|---|---|---|---|
| 9,806,152 | B2* | 10/2017 | Akiyama | .............. H01L 29/102 |
| 2009/0179259 | A1* | 7/2009 | Wang | ............... H01L 21/76254 257/330 |
| 2016/0093624 | A1* | 3/2016 | Luan | ..................... H01L 21/324 257/133 |
| 2017/0213815 | A1* | 7/2017 | Bobde | ............... H01L 29/66371 |
| 2018/0006120 | A1* | 1/2018 | Akiyama | ........... H01L 29/0696 |
| 2018/0166530 | A1* | 6/2018 | Lichtenwalner | .... H01L 29/1095 |
| 2019/0312106 | A1* | 10/2019 | Blanchard | ......... H01L 21/26513 |

\* cited by examiner

*Primary Examiner* — David S Blum
(74) *Attorney, Agent, or Firm* — Patent Law Group; Brian D. Ogonowsky

(57) ABSTRACT

An insulated gate turn-off thyristor has a layered structure including a p+ layer (e.g., a substrate), an n-epi layer, a p-well, vertical insulated gate regions formed in the p-well, and an n− layer over the p-well and between the gate regions, so that vertical npn and pnp transistors are formed. After forming the p-well, boron ions are implanted into the exposed surface of the p-well to form a p+ region. The n-epi layer is then grown over the p-well and the p+ region, and the boron in the p+ region is diffused upward into the n-epi layer and downward to form an intermediate p+ region. The p-well's highly doped intermediate region enables improvement in the npn transistor efficiency as well as enabling more independent control over the characteristics of the n-type layer (emitter) and the overall dopant concentration and thickness of the p-type base to optimize the thyristor's performance.

11 Claims, 5 Drawing Sheets

VERTICAL INSULATED GATE TURN-OFF THYRISTOR WITH INTERMEDIATE P+ LAYER IN P-BASE FORMED USING EPITAXIAL LAYER

CROSS-REFERENCE TO RELATED APPLICATIONS

This application claims priority from provisional application Ser. No. 62/689,622, filed Jun. 25, 2018, by Hidenori Akiyama and Richard A. Blanchard.

FIELD OF THE INVENTION

This invention relates to insulated gate turn-off thyristors and, in particular, to a method for forming a vertical IGTO thyristor that includes a special p-dopant profile in its npn transistor base to improve operating characteristics.

BACKGROUND

FIG. 1 is a cross-sectional view of a portion of a prior art insulated gate turn-off (IGTO) thyristor 10 described in the inventor's U.S. Pat. No. 9,806,152, incorporated herein by reference.

The IGTO thyristor 10 has an npnp layered structure that forms vertical npn and pnp transistors. The layered structure includes a p+ substrate 12, an n+ buffer layer 13, an n-layer 14 (pnp base), a p-well 36 (npn base), gate oxide 25 surrounding vertical gates 26 which are formed in the p-well 36, an intermediate p+ layer 37 formed in the p-well 36, an n-layer 38 over the p-well 36, and an n+ emitter 18. A metal cathode electrode 22 contacts the n+ emitter 18 through an opening in the dielectric layer 40. A metal anode electrode 20 contacts the p+ substrate 12.

FIG. 2 illustrates the relative impurity (dopant) concentrations along the vertical center-line of the IGTO thyristor 10.

When a forward voltage is applied between the cathode electrode 22 and anode electrode 20 and when the gates 26 are sufficiently biased positive, an n-type inversion layer surrounds the gates 26 in the p-well 36 and p+ layer 37, causing the effective p-type base of the npn transistor to be narrowed to increase its beta. Thus, the n+ emitter 18, the underlying n– layer 38, and the underlying p-well 36 form the source and body of a vertical n-channel MOSFET.

When the product of the betas of the npn and pnp transistors exceeds one, controlled latch-up of the thyristor is initiated by regenerative action. The p-well's highly doped intermediate p+ layer 37 allows better control of the npn transistor efficiency while also providing more independent control over the characteristics of the n– layer 14, the emitter-base junction characteristics, and the overall dopant concentration and thickness of the p-well 36 (npn base).

In the fabrication method described in U.S. Pat. No. 9,806,152, the p-well 36 initially extends to the top surface of the silicon. The intermediate p+ layer 37 is formed using a high energy deep implant after the p-well 36 is completely formed. The p-well 36 must be relatively thick in a high voltage IGTO thyristor, so the energy needed to implant the p+ layer 37 is much higher than the implant energies used for forming conventional low-power devices. Unfortunately, such high energy implanters are not present in most semiconductor manufacturing facilities. Additionally, deep implants cause damage to the crystalline structure, which reduces the carrier lifetimes.

The intermediate p+ layer 37 should have a p-dopant concentration at least 1.5 times higher than that of the remainder of the p-well 36. An upper limit to the p+ dopant concentration may be 10 times that of the p-well 36. A higher breakdown voltage of the device is achieved since the p+ layer 37 does not deplete as much as the more lightly doped p-well 36 (npn base) during an off state. So the dopant concentration of the p-well 36 can be reduced (compared with the prior art device) without lowering the breakdown voltage.

Additionally, electron injection efficiency from the n+ emitter 18 into the p-well 36 is improved due to the lower dopant concentration of the p-well 36.

Further, as a result the increased peak dopant level near the middle of the p-well 36 (a p base), the off-state beta of the npn transistor can be reduced, which further increases breakover voltage. Breakover is the voltage at which the thyristor conducts through the bulk silicon, rather than by gate-controlled action. Ideally, the breakover voltage is designed to be equal to the breakdown voltage of the inherent reverse biased pn junction.

When a threshold voltage is applied to the gate 26, the inversion of the p-well 36 and p+ layer 37 around the gate 26 effectively bypasses the p+ layer 37 by extending the npn transistor emitter to below the gate 26, so the p+ layer 37 only lowers the beta of the npn transistor when there is no inversion of the base.

After the high energy implant into the p-well 36, the n-layer 38 and n+ emitter 18 are formed by much lower energy ion implants of an n-type dopant into the top surface of the p-well 36 to convert the top surface to n-type.

Besides the difficulties of using a high energy implant to form the p+ layer 37, another issue with the fabrication technique described in U.S. Pat. No. 9,806,152 is that it is difficult to obtain an optimal dopant concentration in the n-layer 38 and the p-well 36, since the p-well 36 is counter-doped to form the n-layer 38 and n+ emitter 18. It is desirable to provide a relatively high dopant concentration in the p-well 36 to obtain a high breakdown voltage. So counter-doping the p-well 36 with relatively large doses of the n-type dopant to achieve the desired dopant concentration in the n-layer 38 and n+ emitter 18 is difficult. In other words, the dopant concentrations in the p-well and the n layer 38 are not independently controlled, which leads to trade-offs rather than optimization.

There are also trade-offs with forward voltage, switching losses, and breakdown voltage. So, it would be desirable to have independent control of the doping of the p-well 36, p+ layer 37, n-layer 38, and n+ emitter 18.

Another issue with the device of FIG. 1 is that the p+ layer 37 extends completely between the gates 26. So, the dopant concentration in the p+ layer 37 affects both the inversion layer during operation (e.g., affects the threshold voltage of the thyristor) and the p-channel MOSFET threshold voltage. This interdependency results in trade-offs in performance.

What is needed is a technique to form a structure similar to that of FIG. 1 that does not require a high energy implant to form the p+ layer 37 and does not suffer from the drawbacks discussed above.

SUMMARY

A technique is described for forming an IGTO thyristor similar to that of FIG. 1 but without using a high energy implant to form the intermediate p+ layer.

In this process, a low energy implant of a p-type dopant (boron) into the exposed top surface of the p-well is performed to cause the top surface of the p-well to be heavily doped p+.

Then, a thin n-type epitaxial layer is grown over the p-well and p+ layer. During a drive-in step, the boron in the p+ layer diffuses upward into the n-type epitaxial layer (and downward into the p-well) to form the remainder of the p-well with an embedded intermediate p+ layer.

The n+ emitter is then implanted into the top surface of the n-type epitaxial layer.

In one embodiment, a shallow p+ region is formed by implantation on both sides of the n+ emitter next to the gates for forming a vertical p-channel MOSFET. This vertical p-channel MOSFET is used to rapidly turn the thyristor off at a negative gate voltage by shorting the base and emitter of the npn transistor. The vertical p-channel MOSFET has no effect when the gate voltage is zero or positive.

Any other fabrication steps may be the same as used for forming the IGTO thyristor of FIG. 1.

By using the present process, the thickness and profile of the intermediate p+ layer can be designed to be different from the thickness and profile using a high energy implant to optimize its effect. Further, the dopant concentrations in the p-well and n-layer are independently controllable to optimize performance parameters, since the n-layer does not need to be formed by counter-doping the p-well.

Another advantage with the inventive process is that it enables the p+ layer to have more controllable/repeatable dimensions so it can be formed to have a predetermined lateral spacing from the gates. This allows the inversion layer adjacent to the gates to not be affected by the doping levels in the "spaced" p+ layer. In other words, the conduction along the sidewalls of the gates is not affected by the p+ layer.

Various tradeoffs with dopant concentrations and layer thicknesses are discussed below.

BRIEF DESCRIPTION OF THE DRAWINGS

Elements labeled with the same numeral in the various figures may be the same or equivalent.

DETAILED DESCRIPTION

FIGS. 3-6 illustrate an IGTO thyristor fabrication process in accordance with one embodiment of the invention. Details regarding doping levels and tradeoffs will follow.

Figure 3:
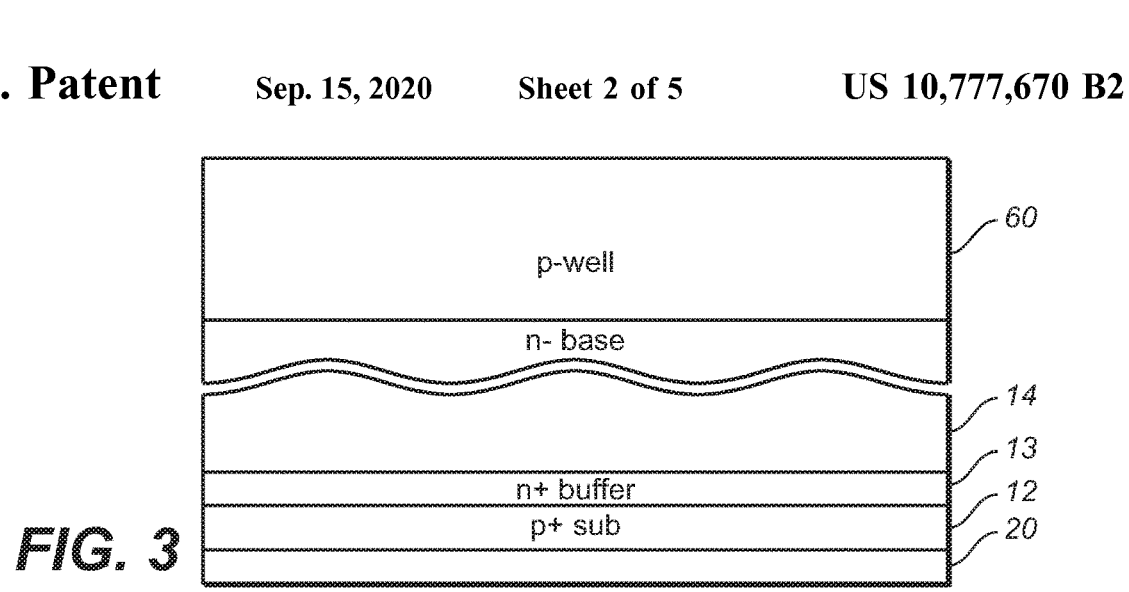
FIG. 3 is a cross-section of an IGTO thyristor during fabrication, in accordance with one embodiment of the invention.

In FIG. 3, the n+ buffer 13 and n-layer 14 are epitaxially grown over the p+ substrate 12. These layers may be the same as described in U.S. Pat. No. 9,806,152. An anode electrode 20 is eventually formed in contact with the substrate 12 at any time during the process.

Over the n-layer 14 is epitaxially grown a p-well 60. The p-well 60 is doped in-situ while being grown. In another embodiment, the p-well 60 is formed by implantation of boron dopants into a top surface of the n-layer 14 and driven in.

Figure 4:
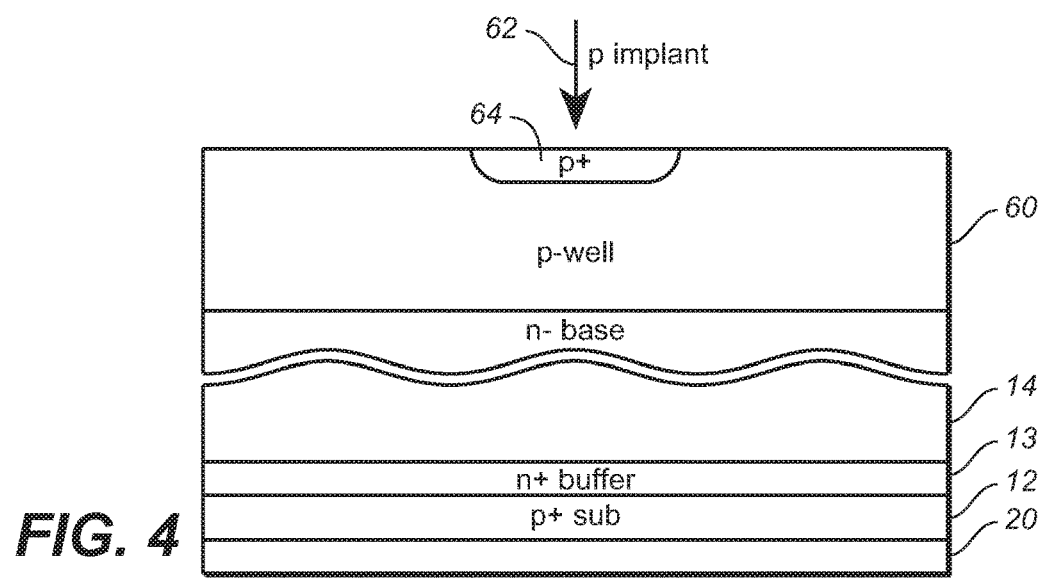
FIG. 4 illustrates the IGTO thyristor of FIG. 3 after further processing.

In FIG. 4, the p-well 60 surface is masked, and a shallow boron implant 62 is performed to create a p+ region 64. The masking and implant energy allows precise control over the width and depth of the p+ region 64. In another embodiment, the boron implant 62 is performed without a mask if the p+ region 64 is to form a continuous layer.

Figure 5:
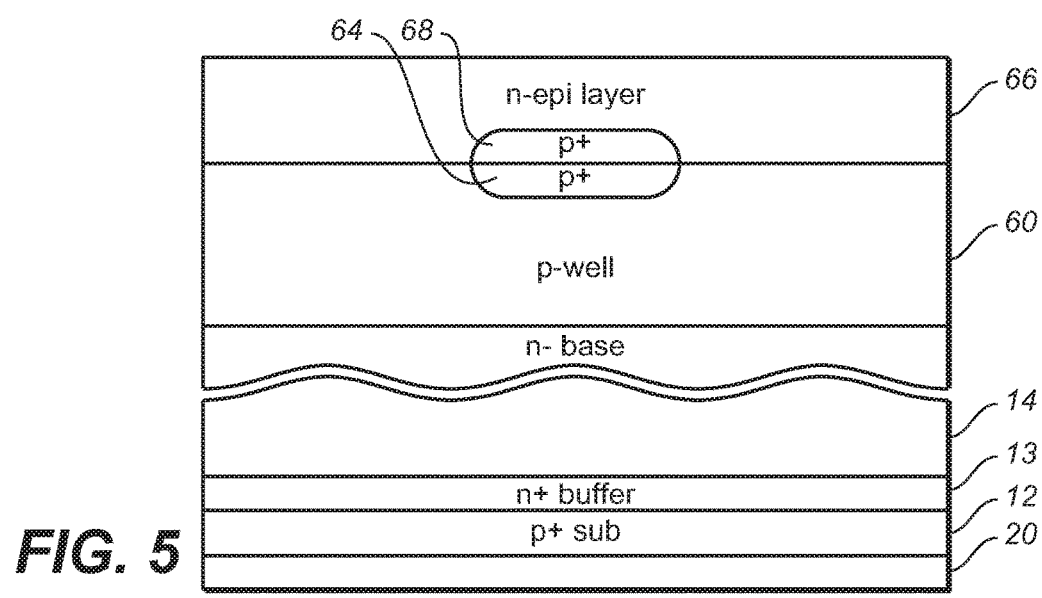
FIG. 5 illustrates the IGTO thyristor of FIG. 4 after further processing.

In FIG. 5, an n-layer 66 is epitaxially grown over the p-well 60. The n-layer 66 is doped in-situ while being grown, in contrast to counter-doping the p-well 60.

The dopants in the p+ region 64 are diffused (up, down, and sideways) by a drive-in heating step. This diffusion causes the p-dopants to extend into the n-layer 66 to form a p+ region 68. Due to the nature of diffusion, the p+ region 68 will be surrounded by a lesser doped p-region (not shown) within the n-layer 66. This lesser doped p-region formed in the n-layer 66 will be part of the p-well 60 since it directly abuts the p-well 60. The combination of the p-well 60 and the p+ regions 66 and 68 form a base for the vertical npn transistor.

If the p+ regions 64/68 extend completely across the cells, the diffusion will create a p+ layer with a lower doped p-layer (forming the p-well 60) above and below the p+ layer, resulting in an intermediate p+ layer within the p-well 60.

The drive-in step may be performed at any time in the fabrication process. However, it may be desirable to diffuse the boron dopants prior to forming the n+ emitter 18 so as not to over-diffuse the n-type dopants in the n+ emitter 18. By using a shallow implant and masking to form the p+ regions 64/68, as opposed to a high energy deep implant, the shape of the p+ regions 64/68 may be more carefully controlled.

Figure 1:
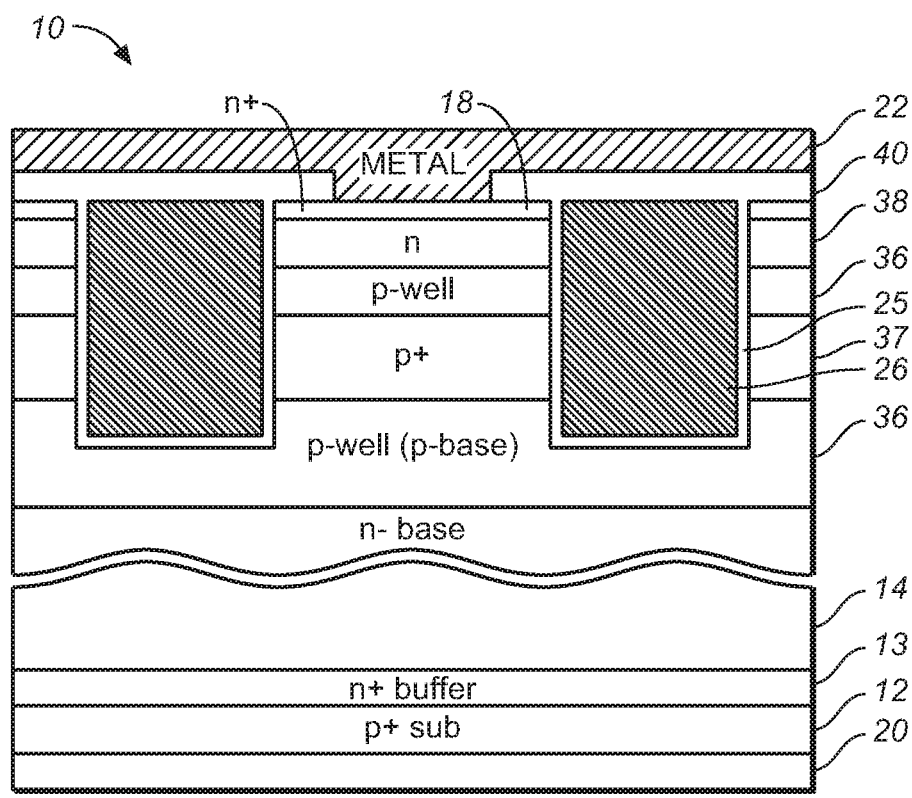
FIG. 1 is a cross-section of an IGTO thyristor from U.S. Pat. No. 9,806,152.
Figure 2:
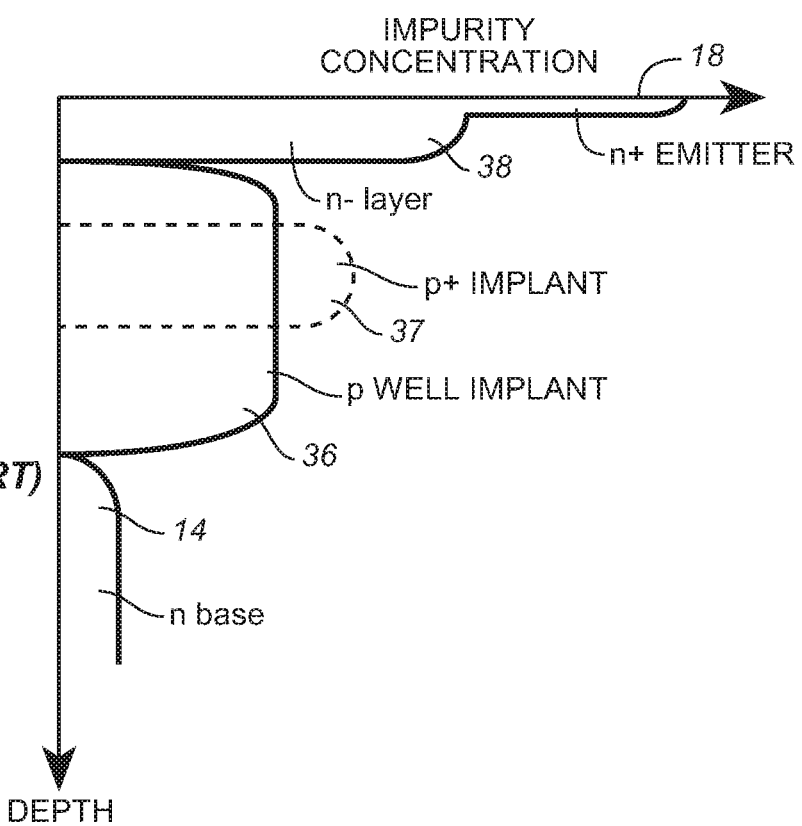
FIG. 2 is a dopant profile of the IGTO thyristor of FIG. 1.

As with FIG. 1, the intermediate p+ regions 64/68 should have a p-dopant concentration at least 1.5 times higher than that of the remainder of the p-well 60. An upper limit to the p+ dopant concentration may be 10 times that of the p-well 60. A higher breakdown voltage of the device is achieved since the p+ regions 64/68 do not deplete as much as the more lightly doped p-well 60 (npn base) during an off state. So the dopant concentration of the p-well 60 can be reduced (compared with the prior art device) without lowering the breakdown voltage.

Additionally, electron injection efficiency from the n+ emitter 18 into the p-well 60 is improved due to the lower dopant concentration of the p-well 60.

Further, as a result the increased peak dopant level within the p-well 60 (a p base), the off-state beta of the npn transistor can be reduced, which further increases breakover voltage. Ideally, the breakover voltage is designed to be equal to the breakdown voltage. Other advantages exist.

Figure 6:
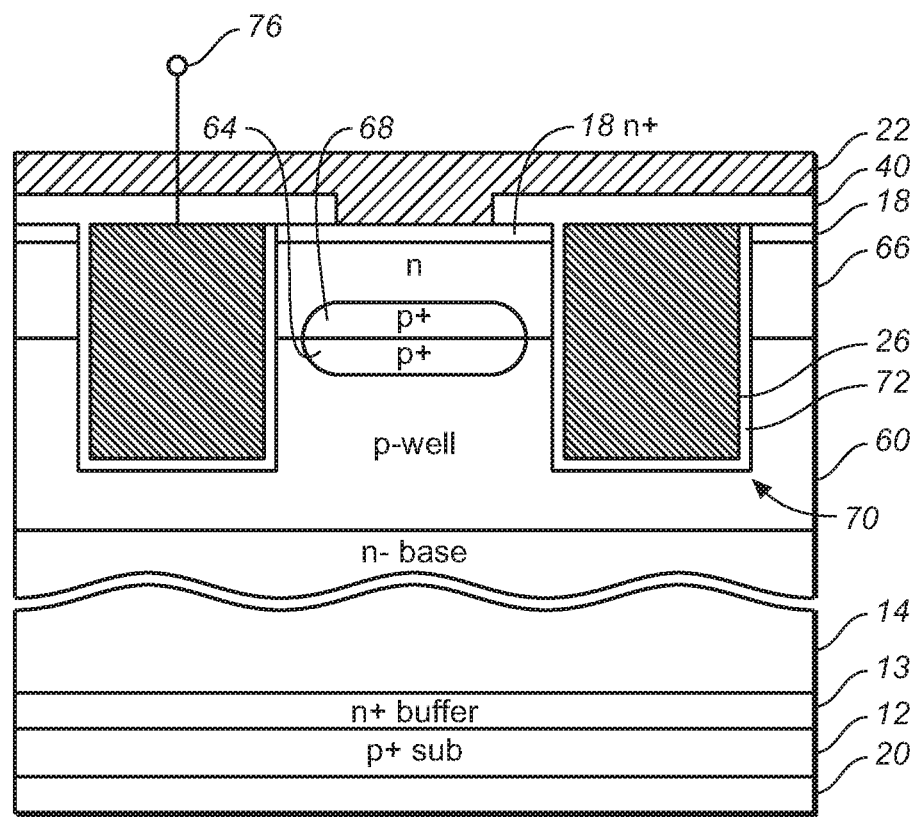
FIG. 6 illustrates the completed IGTO thyristor.

In FIG. 6, the surface is then masked and shallow implants are performed to form an n+ emitter 18. Trenches 70 are formed (by RIE) and coated with a thin gate dielectric 72, such as silicon oxide. The trenches 70 are then filled with a doped polysilicon to form conductive gates 26. Any excess polysilicon is removed from the surface. A dielectric layer 40 is then formed, and a metal cathode electrode 22 is formed to contact the n+ emitter 18.

The p+ regions 64 and 68 may extend completely between the trenches 70 to form a p+ layer or there may be a gap between the p+ regions 64/68 and the trenches 70.

Alignment between the p+ regions 64/68 and the trenches/gates 26 (formed after all the semiconductor regions are formed) may be obtained by forming steps in the surface of the exposed p-well 60 using oxidation and etch stops while introducing the p-type dopant (boron) for the p+ regions 64/68. The step height is determined by the amount of silicon dioxide that is grown and removed in combination with the amount of silicon dioxide that is regrown, as would be well-known to those in the art of semiconductor processing. The selective implantation of the dopants may be performed using other methods as well.

FIG. 6 illustrates a single cell, and the gate pattern is repeated to form an array of cells that operate in parallel to conduct current. The cells may be in the form of long strips, rectangles, hexagons, or other shapes. If the cell structure is a closed shape, the cross-section of FIG. 6 may show portions of the same gate of a single cell. Suitable cells are further discussed in U.S. Pat. No. 9,806,152.

A gate electrode 76 is shown schematically but, since the gates 26 are all interconnected, the actual gate electrode may be along the edge of the die.

As seen, there is no high energy implant needed to form the p+ regions 64 and 68. The p+ region 64/68 doping concentration is independent from the doping concentrations in the p-well 60 and n-layer 66. The doping concentration of the n-layer 66 is independent from the doping concentration in the p-well 60, since the n-layer 66 is not formed by counter-doping the top portion of the p-well 60. The size of the p+ regions 64/68 can be carefully controlled by the masking, implant dosage, and the drive-in (time and/or temperature). The benefits of the p+ layer 64/68 have been discussed with respect to FIG. 1 when discussing the p+ layer 37.

Carrier lifetime may be increased by the elimination of the high energy implant since there is less disruption of the crystalline structure.

The optimal layer thicknesses and dopant concentrations are dependent on the desired breakdown voltage, forward voltage, switching losses, and turn-off time. The various trade-offs are discussed below.

Providing an increased overall dopant concentration in the combined p+ regions 64/68 and p-well 60, increases the breakdown voltage for the same thickness of the layers. Lowering the dopant concentration in the n-layer 66 generally increases the breakdown voltage since it allows for a wider depletion region. However, an increase in the dopant concentration in the p-layer 66 and the n+ emitter 18 lowers the forward voltage (VF) of the IGTO thyristor, due to the increased electron injection by the n+ emitter and the lower resistivity of the n-layer 66, but the switching losses are increased and the breakover voltage is decreased.

As a result of the independent control of the dopant concentrations in the p-well 60, p-layer 66, n+ emitter 18, and p+ region 64/68, the threshold voltage of the p-channel MOSFET (for turn off) can be lowered, the forward voltage can be lowered (e.g., to below 1 volt), the injection efficiency and switching losses can be optimized, and the breakover voltage can be increased along with the breakdown voltage. The device can be fabricated in facilities that do not support a high energy implant.

Another advantage with the inventive process is that it enables the resulting p+ regions 64/68 to have more controllable/repeatable dimensions so they can be formed to have a predetermined lateral spacing from the gates 26, in contrast to the device of FIG. 1. This allows the inversion layer adjacent to the gates to not be affected by the doping levels in the "spaced" p+ layer. In other words, the conduction along the sidewalls of the gates is not affected by the p+ layer. The lateral and vertical size of the p+ regions 64/68 can also be precisely controlled to achieve desired operational parameters of the npn transistor.

Figure 7:
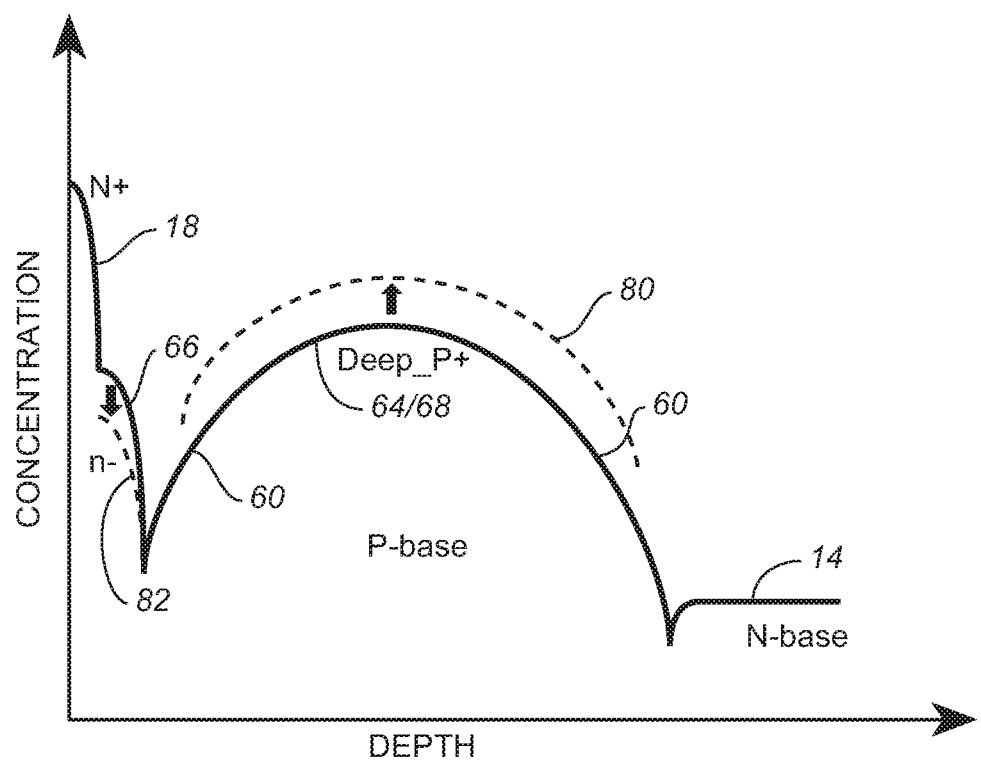
FIG. 7 is a dopant profile of the IGTO thyristor of FIG. 6.

FIG. 7 illustrates the dopant profile along the vertical center line of the thyristor of FIG. 6 and into the n-layer 14 (n-base). The dashed lines 80 and 82 illustrate how the dopant concentrations in the n-layer 66, p-well 60, and p+ regions 64/68 can be independently controlled to achieve the desired optimizations of the IGTO thyristor parameters.

Figure 8:
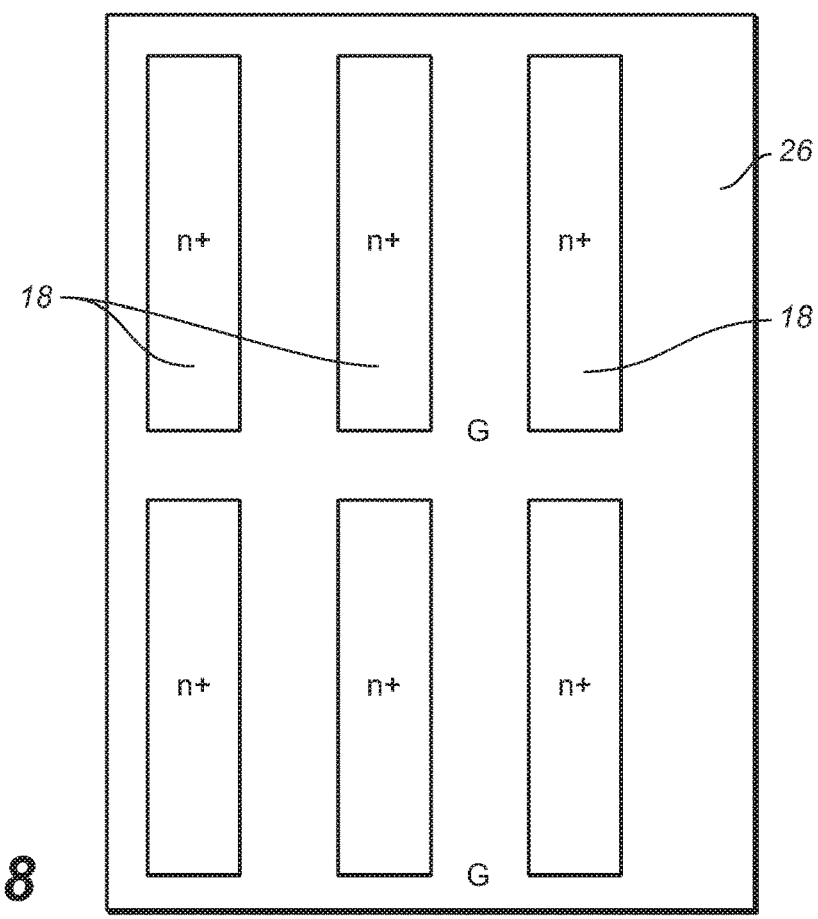
FIG. 8 is a top down view of an array of cells, showing the top surface of the silicon.

FIG. 8 is a top down view of a two-dimensional array of cells, showing the top surface of the silicon. The cells are rectangular, but may be any shape. Below the gates 26, the p+ regions 64/68 may extend completely between the gates 26 or form a central region separated from the gates 26.

The operation of the IGTO thyristor of FIG. 6 is the same as the previously described operation of the IGTO thyristor of FIG. 1. The gates 26 are interconnected and a gate electrode (not shown) may be provided near the edge of the die for wire bonding to package lead.

The polarities of the various semiconductor layers can be opposite such that the cathode electrode is on the bottom and the anode electrode is on top.

Figure 9:
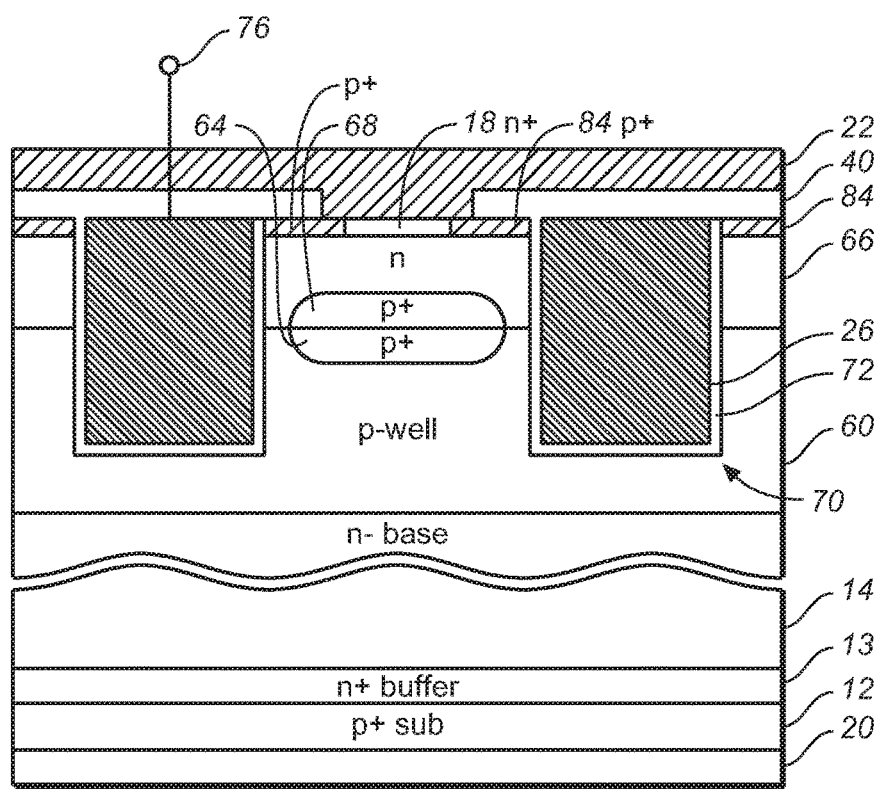
FIG. 9 illustrates the thyristor of FIG. 6 with a vertical p-channel MOSFET added for turning off the thyristor.

FIG. 9 illustrates the thyristor of FIG. 6 but with added p+ regions 84, formed by a shallow implant into the n-layer 66 surface. The p+ regions 84 form part of a vertical p-channel MOSFET that conducts when the gate 26 is negative. When the gate 26 is made negative with respect to the cathode electrode 22 to turn the IGTO thyristor off, a conductive p-type channel is formed along the edge of the n– layer 66, by inversion, to effectively short the n+ emitter 18 of the npn transistor to its base (p-well 60) to quickly turn off the npn transistor to stop current flow through the device. The p-channel MOSFET and cathode electrode 22 rapidly remove hole carriers to accelerate the turn-off. By using the p-type base profile with the intermediate p+ layer 64/68, the n-type layer 66 (acting as a channel region for the p-channel MOSFET) can be more lightly doped to lower the threshold voltage of the p-channel MOSFET. The use of the p+ region 84 is optional, since the IGTO thyristor can also be turned off without the p-channel MOSFET by making the gate 26 negative, although the turn-off is not as rapid and the gate turn-off voltage is not as controllable.

Figure 10:
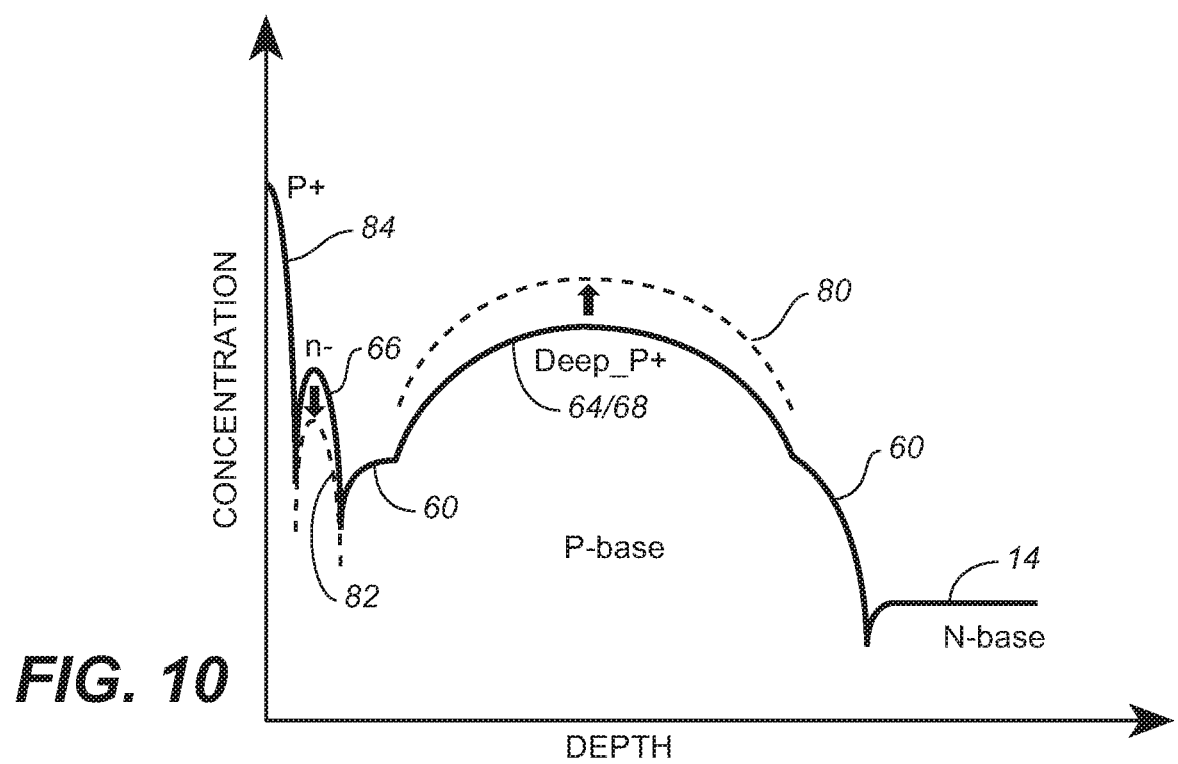
FIG. 10 is a dopant profile of the IGTO thyristor of FIG. 9.

FIG. 10 is a dopant profile of the thyristor of FIG. 9 along the edge of the gates 26, but where the p+ layer 64/68 extends completely between the gate trenches.

Instead of an enhancement mode p-channel MOSFET, a depletion mode MOSFET can be used instead to turn the thyristor off at a zero gate voltage.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A method for forming an insulated gate turn-off thyristor comprising:
providing a first semiconductor layer of a first conductivity type;

forming a second semiconductor layer of a second conductivity type over the first semiconductor layer;

forming a third semiconductor layer of the first conductivity type over the second semiconductor layer;

implanting dopants of the first conductivity type into a top surface of the third semiconductor layer;

growing an epitaxial layer of the second conductivity type over the top surface of the third semiconductor layer;

driving in the implanted dopants of the first conductivity type so that the dopants of the first conductivity type diffuse into the epitaxial layer of the second conductivity type and diffuse into the third semiconductor layer, wherein the diffused implanted dopants of the first conductivity type in the third semiconductor layer and the epitaxial layer form an intermediate portion of the first conductivity type having a dopant concentration at least 1.5 times the dopant concentration in the third semiconductor layer;

forming a matrix of cells comprising a plurality of insulated gates within trenches formed within the epitaxial layer of the second conductivity type and the third semiconductor layer but not extending to the second semiconductor layer; and forming first regions of the second conductivity type in a top surface of the epitaxial layer of the second conductivity type, between the gates, wherein a vertical structure of npn and pnp transistors is formed, and conduction between the first semiconductor layer and the first regions of the second conductivity type is controlled by a voltage applied to the gates, wherein the gates are configured to form an inversion layer in the third semiconductor layer, when a certain potential is applied to the gates, to reduce an effective base width of one of the npn transistor or the pnp transistor to increase its beta to initiate regenerative thyristor action.

2. The method of claim 1 wherein there is a gap between the intermediate portion of the first conductivity type and adjacent trenches.

3. The method of claim 1 wherein the intermediate portion of the first conductivity type extends completely between adjacent trenches.

4. The method of claim 1 wherein the first conductivity type is a p-type and the second conductivity type is an n-type.

5. The method of claim 1 wherein the first conductivity type is an n-type and the second conductivity type is a p-type.

6. The method of claim 1 wherein the first semiconductor layer is a substrate.

7. The method of claim 1 wherein the third semiconductor layer is a well.

8. The method of claim 1 wherein the first semiconductor layer acts as an emitter for the pnp transistor, the second semiconductor layer acts as a base for the pnp transistor and a collector for the npn transistor, the third semiconductor layer acts as a base for the npn transistor and a collector for the pnp transistor, and the first regions of the second conductivity type act as emitters for the npn transistor.

9. The method of claim 1 further comprising forming second regions of the first conductivity type in the top surface of the epitaxial layer of the second conductivity type, wherein the second regions form part of a vertical MOSFET for turning off the thyristor.

10. The method of claim 1 wherein the intermediate portion has a dopant concentration between 1.5 and 10 ten times the dopant concentration of the third semiconductor layer.

11. The method of claim 1 wherein the step of driving in the implanted dopants occurs after the epitaxial layer of the second conductivity type is grown and before the first regions of the second conductivity type are formed.

* * * * *